United States Patent [19]

Williams et al.

[11] Patent Number: 4,759,310
[45] Date of Patent: Jul. 26, 1988

[54] AUTOMATED SYSTEM FOR RECONDITIONING ELECTRICAL TERMINALS

[75] Inventors: Lee C. Williams, San Marcos; Richard B. McGee, San Diego, both of Calif.

[73] Assignee: M/A-COM Government Systems, Inc., San Diego, Calif.

[21] Appl. No.: 864,494

[22] Filed: May 19, 1986

[51] Int. Cl.[4] .......................... B05C 11/00; B05C 3/10; B05C 13/02

[52] U.S. Cl. .................................... 118/681; 118/74; 118/421; 118/500; 118/682; 118/699; 118/703; 118/704

[58] Field of Search .................. 228/37, 43; 118/74, 118/421, 696, 699, 702, 681, 682, 703, 704, 500

[56] References Cited

U.S. PATENT DOCUMENTS

| | | | |
|---|---|---|---|
| 2,615,421 | 10/1952 | Davis et al. | 118/702 |
| 2,771,047 | 11/1956 | Zimmerman | 118/421 X |
| 2,776,640 | 1/1957 | Miklofsky et al. | 228/43 X |
| 3,498,258 | 3/1970 | Swaisgood | 118/74 |
| 3,765,591 | 10/1973 | Cook | 228/37 X |
| 3,863,764 | 2/1975 | Wyslinski et al. | 118/620 X |
| 3,896,762 | 7/1975 | Banker | 118/416 X |
| 4,602,417 | 7/1986 | Mesch et al. | 228/47 X |

*Primary Examiner*—Evan K. Lawrence
*Attorney, Agent, or Firm*—Edward W. Callan

[57] ABSTRACT

An automated system for reconditioning electrical terminals of an electrical work piece, such as a leadless chip carrier. The system includes a carrousel which stops upon rotating each 360/n degrees (wherein "n" is an integer greater than three), dwells, and then resumes rotation. "n" work piece holding assemblies are respectively uniformly disposed on the carrousel and include vacuum tips extending over the periphery of the carrousel for holding work pieces over work stations positioned adjacent and around the periphery of the carrousel beneath the positions occupied by the vacuum tips when the carrousel stops and dwells. A first work piece feed mechanism is located at a sequentially first work station for feeding a work piece to the vacuum tip positioned over the first work station when the carrousel is dwelling. A flux bath is located at a sequentially second work station for bathing a work piece held by the vacuum tip positioned over the second work station when the carrousel is dwelling. A solder well is located at a sequentially third work station for reconditioning the electrical terminal(s) of a work piece held by the vacuum tip positioned over the third work station when the carrousel is dwelling. A second work piece feed mechanism is located at a sequentially fourth work station for feeding a work piece from the vacuum tip positioned over the fourth work station when the carrousel is dwelling.

10 Claims, 2 Drawing Sheets

AUTOMATED SYSTEM FOR RECONDITIONING ELECTRICAL TERMINALS

BACKGROUND OF THE INVENTION

The present invention pertains to apparatus for reconditioning electrical terminals of electrical work pieces, such as leadless chip carriers (LCC's).

Oftentimes it is necessary to recondition the electrical terminals of electrical work pieces prior to connecting the work pieces to a circuit board. Such reconditioning is necessary to assure quality if the work piece has been stored for a long time following manufacture, because intermetallic growth occurs in the terminals over a prolonged period. Also, some terminals include gold, which must be removed and replaced with a tin-lead solder in order to meet certain prescribed manufacturing standards. Such reconditioning is sometimes referred to as pretinning.

Typically, the reconditioning is accomplished by manually handling each work piece and performing the steps of bathing the work piece in a flux bath, placing the bathed work piece in a liquid solder well to remove any gold and provide new solder to the terminals, and cooling and the cleaning the work piece.

SUMMARY OF THE INVENTION

The present invention is an automated system for reconditioning electrical terminals of an electrical work piece. The system includes a carrousel; a motor for rotating the carrousel; a motor control system for controlling the rotation of the carrousel so that the carrousel stops upon rotating each 360/n degrees (wherein "n" is an integer greater than three), dwells, and then resumes said rotation; "n" work piece holding assemblies respectively uniformly disposed on the carrousel about and extending over the periphery of the carrousel for holding work pieces over work stations positioned adjacent and around the periphery of the carrousel beneath the positions occupied by the extensions of the holding assemblies when the carrousel stops and dwells; a first work piece feed mechanism located at a sequentially first work station for feeding a work piece to the holding assembly positioned over the first work station when the carrousel is dwelling; a flux bath located at a sequentially second work station for bathing a work piece held by the holding assembly positioned over the second work station when the carrousel is dwelling; a solder well located at a sequentially third work station for reconditioning the electrical terminal(s) of a work piece held by the holding assembly positioned over the third work station when the carrousel is dwelling; and a second work piece feed mechanism located at a sequentially fourth work station for feeding a work piece from the holding assembly positioned over the fourth work station when the carrousel is dwelling. Each holding assembly includes a vacuum tip and a vacuum generator for creating a vacuum at the vacuum tip for holding a work piece contacting the vacuum tip.

The reconditioning process is easier to control with the automated system of the present invention than with the prior art manual reconditioning procedure. With the automated system of the present invention the uniformity and the thickness of the solder is easier to control, labor requirements are greatly reduced, productivity is greatly increased, less floor space is required, and such damage from handling as resulted from dropping a work piece in the solder is eliminated.

Additional features of the present invention are described in relation to the description of the preferred embodiment.

DESCRIPTION OF THE PREFERRED EMBODIMENT

Figure 1:
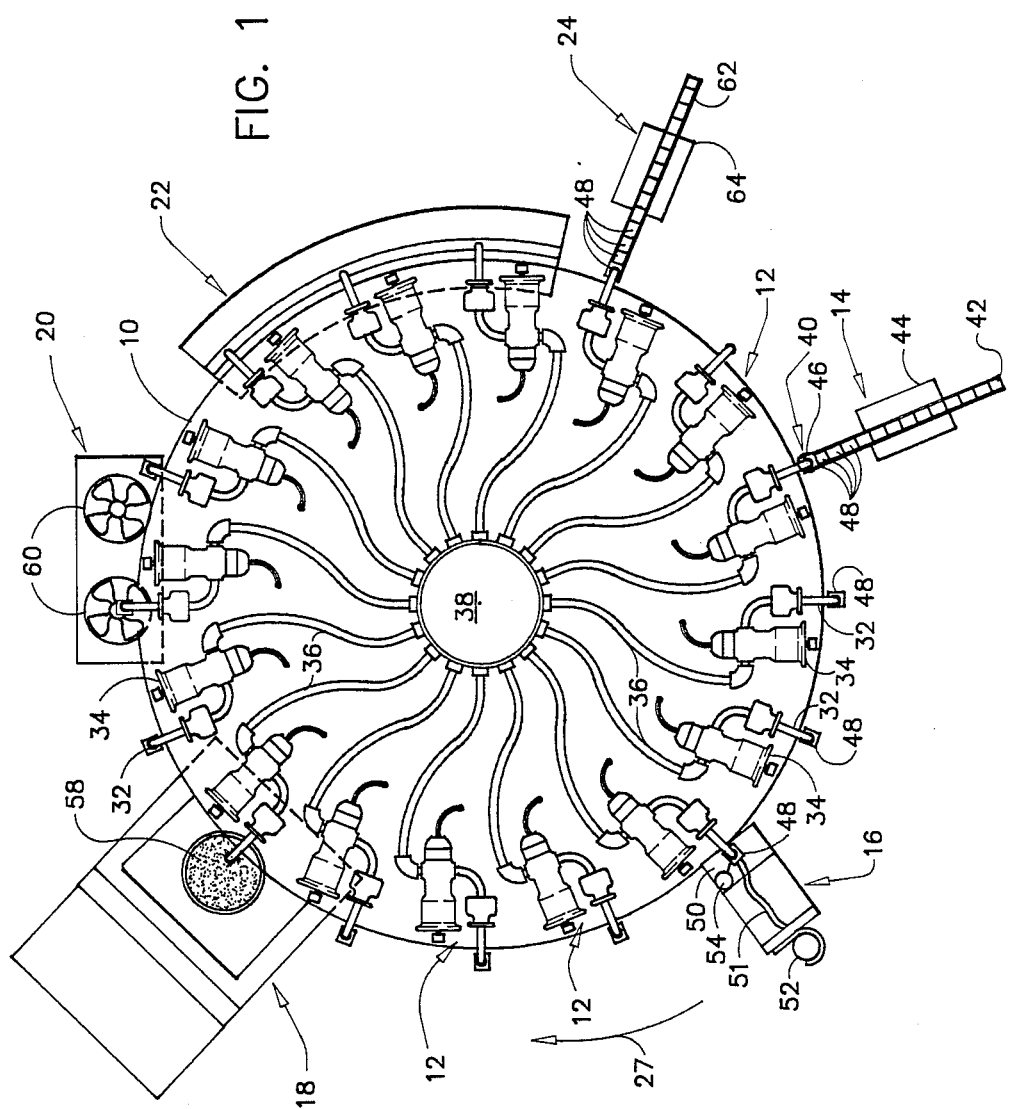
FIG. 1 is a top view of the system of the present invention.

Referring to FIG. 1, the preferred embodiment of the automated system of the present invention includes a carrousel 10, sixteen work piece holding assemblies 12, an input work piece feed mechanism 14, a flux bath assembly 16, a solder well assembly 18, a cooling station 20, a cleaning station 22 and an output work piece feed mechanism 24.

The carrousel 10 is rotated by a motor 26 (FIG. 2) in a clockwise direction (as shown by reference arrow 27) under the control of a motor control unit 28. A proxistor is used as a carrousel rotary angle sensor 30 to sense when the carrousel rotates every twenty-two-and-one-half degrees. The proxistor is positioned to sense the passage of each of the sixteen work piece holding assemblies 12, which are positioned twenty-two- and-one-half degrees apart about the periphery of the carrousel 10. The carrousel rotary angle sensor 30 provides a signal on line 31 upon each sensing of a work piece holding assembly 12. The motor control unit 28 responds to the signal on line 31 by causing the 26 motor to stop. The motor control unit 28 restarts the motor 26 after an interval of approximately three to five seconds, whereupon the carrousel rotates for another twenty-two-and-one-half degrees before stopping again and dwelling until the motor is again restarted.

Each of the sixteen work piece holding assemblies 12 includes a vacuum tip 32 and a vacuum generator 34. The vacuum generators 34 receive air through hoses 36 connected to an air manifold 38 extending up through the center of the carrousel 10 from beneath. The work piece holding assemblies 12 are respectively uniformly disposed on the carrousel 10, with the vacuum tips 32 extending over the periphery of the carrousel 10 for holding work pieces, such as LCC's, over work stations positioned adjacent and around the periphery of the carrousel 10 beneath the positions occupied by the vacuum tips 32 when the carrousel 10 stops and dwells.

The input work piece feed mechanism 14 is located at a sequentially first work station 40. The input work piece feed mechanism 14 includes a chute 42, a vibrator 44 and a chip lift 46. The preferred embodiment is adapted for reconditioning LCC's, but is equally useful for reconditioning the terminals of other types of electrical work pieces. The LCC's 48 are placed in the chute 42, which is inclined toward the work station 40, and which is vibrated by the vibrator 44. As the chute 42 is vibrated, the LCC's migrate toward the end position of the chute 42 adjacent the chip lift 46. The chip lift 46 is positioned immediately beneath the vacuum tip 32. The chip lift 46 responds to the signal provided on line 31 by the carrousel rotary angle sensor 30 each time it senses rotation of twenty-two-and-one-half degrees by lifting an LCC 48 received from the end position of the chute 42 up into contact with the vacuum tip 32 when the carrousel 10 is dwelling with the vacuum tip over the chip lift 46. The LCC 48 is thereafter held by the vacuum tip 32, and the chip lift 46 is lowered to the level of the end position of the chute 42.

Figure 2:
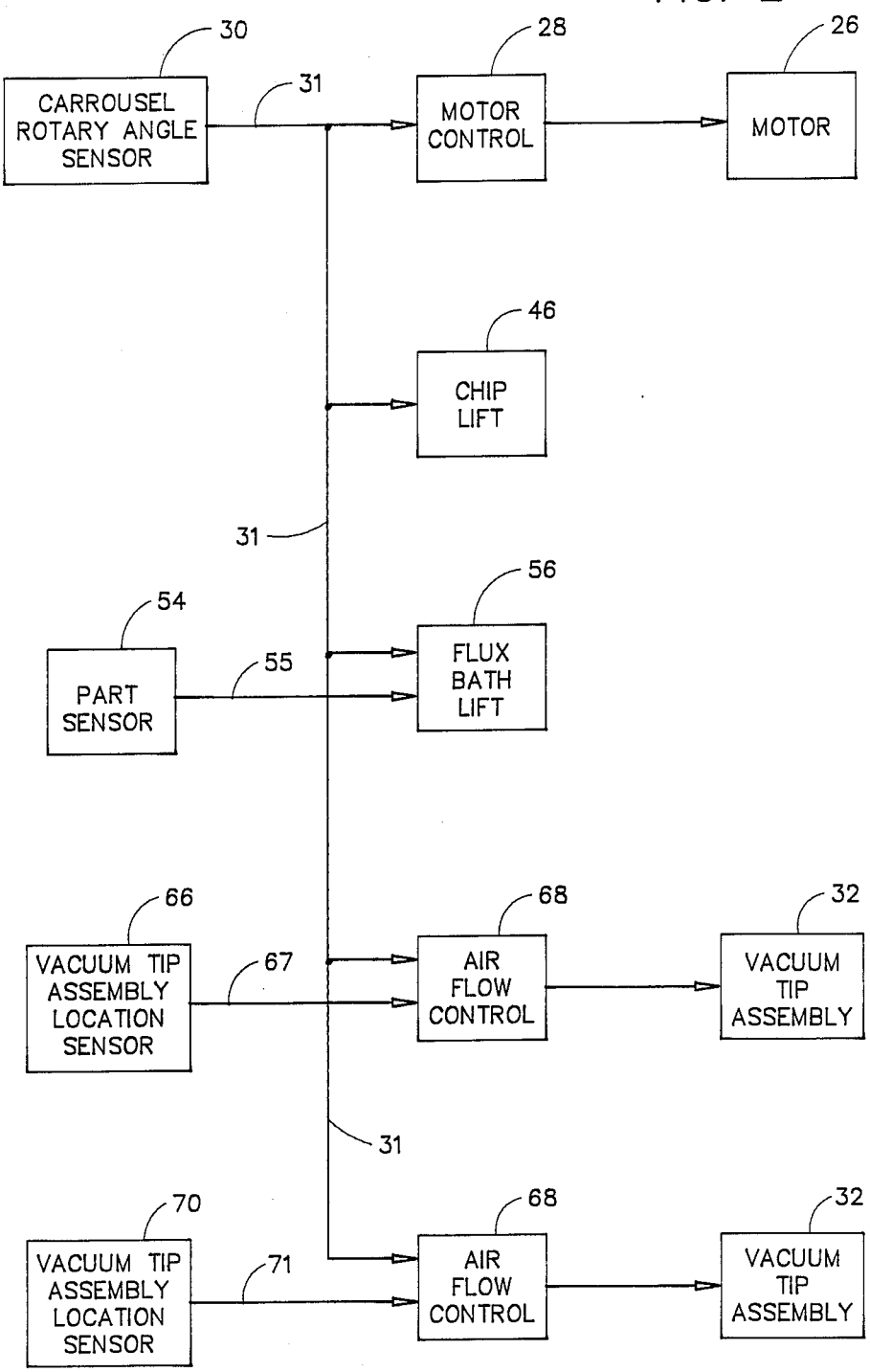
FIG. 2 is block diagram illustrating the functional control of the system of FIG. 1.

The flux bath assembly 16 is located at a sequentially second work station for bathing a work piece 48 held by a vacuum tip 32 positioned over the flux bath when the carrousel is dwelling. The flux bath assembly 16 includes a tub 50, which is fed with flux through a hose 51 from a bottle 52. The flux bath assembly 16 further includes a part sensor 54, which includes an arm that is contacted and moved by an LCC 48 held by a vacuum tip 32 over the flux bath tub 50. Movement of the arm actuated a switch, which results in a signal being provided on line 55 from the part sensor 54 to a flux bath lift 56 (FIG. 2). The flux bath lift 56 responds to the signal on line 55 and the signal on line 31, which indicates that the carrousel 10 has rotated twenty-two-and-one-half degrees and is dwelling, by lifting the flux bath assembly 16 so that the LCC 48 held by the vacuum tip 32 is immersed in the flux in the tub 50 and bathed by the flux. The flux bath assembly 16 is then lowered by the flux bath lift 56 to its original position in which an LCC can be sensed by the part sensor 54.

The solder well assembly 18 is located at a sequentially third work station for reconditioning the electrical terminals of an LCC 48 positioned over the solder well assembly 18 when the carrousel 10 is dwelling. The solder well assembly 18 includes a solder well 58. Liquid solder flows up through the solder well 58 and over the edge of the well 58 to provide a flowing flat solder wave at the top of the well 58. As the carrousel 10 rotates, the LCC 48 held by the vacuum tip 32 is drug through the solder wave until the carrousel 10 stops rotating with the LCC 48 in the solder wave. The LCC 48 thus dwells in the solder wave while the carrousel 10 is dwelling, and the terminals of the LCC 48 are reconditioned by the flowing solder wave.

The cooling station 20, which includes two fans 60, is positioned adjacent the periphery of the carrousel 10 for cooling the reconditioned LCC's 48 held by the vacuum tips 32 as the carrousel 10 rotates the LCC's 48 away from the solder well assembly 18.

The cleaning station 22 is positioned adjacent the periphery of the carrousel 10 for cleaning the reconditioned and cooled LCC's 48 held by the vacuum tips 32 as the carrousel rotates the LCC's away from the cooling station 20. The cleaning station 22 includes a freon solvent bath for cleansing the LCC's 48.

The output work piece feed mechanism 24 is positioned at a sequentially fourth work station located adjacent the periphery of the carrousel sequentially beyond the cleaning station 22 as the carrousel 10 rotates. The output work piece feed mechanism 24 feeds LCC's 48 away from the vacuum tip 32 positioned over the mechanism 24 when the carrousel 10 is dwelling. The output mechanism 24 includes a chute 62, which is inclined away from the carrousel 10, and a vibrator 64, which vibrates the chute 62.

A first vacuum tip assembly location sensor 66 (FIG. 2) senses the rotary position of the work piece holding assemblies 12 in relation to the fourth work station and provides a release signal on line 67 to an air flow control unit 68 in whichever work piece holding assembly 12 is positioned over the fourth work station when the carrousel 10 is dwelling. The air flow control unit 68 causes the air from the hose 36 (FIG. 1) to be diverted from the vacuum generator 34 to the vacuum tip 32 to cause air to flow out from the vacuum tip 32 and thereby release the LCC 48 from the vacuum tip 32 onto the end of the chute 62 adjacent the carrousel 10. As the vibrator 64 vibrates the chute 62, the LCC's 48 migrate down the chute away from the carrousel 10.

A second vacuum tip assembly location sensor 70 (FIG. 2) senses the rotary position of the work piece holding assemblies 12 in relation to a sequentially fifth work station located adjacent the periphery of the carrousel 10 beyond the fourth work station and beneath a vacuum tip 32 when the carrousel 10 is dwelling. The second vacuum tip assembly location sensor 70 provides a release signal on line 71 to the air flow control unit 68 in whichever work piece holding assembly 12 is positioned over the fifth work station when the carrousel 10 is dwelling. The air flow control unit 68 causes the air from the hose 36 (FIG. 1) to be diverted from the vacuum generator 34 to the vacuum tip 32 to cause a burst of air to flow out from the vacuum tip 32 to blow any residue, such as solder, from the vacuum tip 32.

Although the system of the present invention has been described for use in reconditioning electrical terminals of LCC's it also may be used for reconditioning terminals of other types of electrical work pieces.

What is claimed is:

1. A system for reconditioning electrical terminals of an electrical work piece, comprising
   a carrousel;
   means for rotating the carrousel;
   means for controlling the rotation of the carrousel so that the carrousel stops upon rotating each 360/n degrees (wherein "n" is an integer greater than three), dwells, and then resumes said rotation;
   "n" work piece holding assemblies respectively uniformly disposed on the carrousel about and extending over the periphery of the carrousel for holding work pieces over work stations positioned adjacent and around the periphery of the carrousel beneath the positions occupied by said extensions of the holding assemblies when the carrousel stops and dwells;
   a first work piece feed mechanism located at a sequentially first work station for feeding a work piece to the holding assembly positioned over the first work station when the carrousel is dwelling;
   a flux bath located at a sequentially second work station for bathing a work piece held by the holding assembly positioned over the second work station when the carrousel is dwelling;
   a solder well located at a sequentially third work station for reconditioning the electrical terminal(s) of a work piece held by the holding assembly positioned over the third work station when the carrousel is dwelling; and
   a second work piece feed mechanism located at a sequentially fourth work station for feeding a work piece from the holding assembly positioned over the fourth work station when the carrousel is dwelling;
   wherein each holding assembly comprises a vacuum tip and means for creating a vacuum at the vacuum tip for holding a work piece contacting the vacuum tip.

2. A system according to claim 1, further comprising;
   means for sensing the rotary position of the respective holding assemblies with respect to the fourth work station and for providing a release signal to whichever holding assembly is positioned over the fourth work station when the carrousel is dwelling; and release means responsive to said release signal for causing the holding assembly positioned over the fourth work station to release the work piece to the second work piece feed mechanism.

3. A system according to claim 2, wherein the release means comprise means responsive to the release signal for causing air to flow out from the vacuum tip to release the work piece.

4. A system according to claim 3, further comprising means for sensing the rotary position of each of the holding assemblies with respect to a sequentially fifth work station and for providing a second release signal to whichever holding assembly is positioned over the fifth work station when the carrousel is dwelling;

wherein the release means respond to the second release signal by causing a burst of air to flow out from the vacuum tip to blow any residue material from the vacuum tip.

5. A system according to claim 1, wherein the first work piece feed mechanism comprises a chute for serially feeding a plurality of work pieces to a position immediately beneath the holding assembly positioned over the first work station when the carrousel is dwelling; and means synchronized with the rotary position control means for lifting a work piece fed from the chute into contact with the vacuum tip positioned over the first work station when the carrousel is dwelling.

6. A system according to claim 1, further comprising means for causing solder to flow up through and over the edge of the solder well to create a flowing flat solder wave at the top of the well, whereby the work piece is drug through the solder wave and then dwells in the solder wave when the carrousel is dwelling.

7. A system according to claim 1, further comprising means positioned adjacent the periphery of the carrousel between the third and fourth work stations for cooling the reconditioned work piece as the work piece is rotated between the third and fourth work stations.

8. A system according to claim 7, further comprising means positioned adjacent the periphery of the carrousel between the cooling means and the fourth work station for cleaning the work piece as the work piece is rotated between the cooling means and the fourth work station.

9. A system according to claim 8, further comprising means positioned adjacent the periphery of the carrousel between the third and fourth work stations for cleaning the work piece as the work piece is rotated between the third and fourth work stations.

10. A system for reconditioning electrical terminals of an electrical work piece, comprising a carrousel;

means for rotating the carrousel;

means for controlling the rotation of the carrousel so that the carrousel stops upon rotating each 360/n degrees (wherein "n" is an integer greater than three), dwells, and then resumes said rotation;

"n" work piece holding assemblies respectively uniformly disposed on the carrousel about and extending over the perihpery of the carrousel for holding work pieces over work stations positioned adjacent and around the periphery of the carrousel beneath the positions occupied by said extensions of the holding assemblies when the carrousel stops and dwells;

a first work piece feed mechanism located at a sequentially first work station for feeding a work piece to the holding assembly positioned over the first work station when the carrousel is dwelling;

a flux bath located at a sequentially second work station for bathing a work piece held by the holding assembly positioned over the second work station when the carrousel is dwelling;

a solder well located at a sequentially third work station for reconditioning the electrical terminal(s) of a work piece held by the holding assembly positioned over the third work station when the carrousel is dwelling;

a second work piece feed mechanism located at a sequentially fourth work station for feeding a work piece from the holding assembly positioned over the fourth work station when the carrousel is dwelling;

means for sensing when a work piece held by a holding assembly is positioned over the second work station when the carrousel is dwelling and for providing a lift signal upon so sensing said work piece; and means responsive to said lift signal for lifting the flux bath to bathe the work piece in the flux bath.

* * * * *